US012723304B2

(12) United States Patent
Fang et al.

(10) Patent No.: US 12,723,304 B2
(45) Date of Patent: Sep. 1, 2026

(54) PARTICLE REDUCTION IN PHYSICAL VAPOR DEPOSITION OF AMORPHOUS SILICON

(71) Applicant: Applied Materials, Inc., Santa Clara, CA (US)

(72) Inventors: Peijiao Fang, Sunnyvale, CA (US); Mingdong Li, Santa Clara, CA (US); Chengyu Liu, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 386 days.

(21) Appl. No.: 18/378,234

(22) Filed: Oct. 10, 2023

(65) Prior Publication Data

US 2024/0128075 A1 Apr. 18, 2024

Related U.S. Application Data

(60) Provisional application No. 63/416,083, filed on Oct. 14, 2022.

(51) Int. Cl.
*C23C 14/56* (2006.01)
*C23C 14/00* (2006.01)
(Continued)

(52) U.S. Cl.
CPC ........ *C23C 14/564* (2013.01); *C23C 14/0036* (2013.01); *C23C 14/024* (2013.01);
(Continued)

(58) Field of Classification Search
CPC . C23C 14/564; C23C 14/0036; C23C 14/024; C23C 14/0635; C23C 14/0676; C23C 14/10; C23C 14/14; H01L 21/02532; H01L 21/02592; H01L 21/02631; H10P 14/3411; H10P 14/22; H10P 14/3454
See application file for complete search history.

(56) References Cited

U.S. PATENT DOCUMENTS 9,773,665 B1 * 9/2017 Zeng .................... C23C 14/024
2001/0004121 A1 * 6/2001 Sakama ................ H10D 86/60 257/E27.111

(Continued)

OTHER PUBLICATIONS

PCT International Search Report and Written Opinion for PCT/US2023/034799 dated Jan. 29, 2024.

*Primary Examiner* — Ratisha Mehta
*Assistant Examiner* — Brad A Knudson
(74) *Attorney, Agent, or Firm* — Moser Taboada

(57) ABSTRACT

Methods for depositing amorphous silicon films via physical vapor deposition processes are disclosed. In some embodiments, a method of depositing amorphous silicon in a physical vapor deposition (PVD) process chamber includes (a) depositing an amorphous silicon layer atop a surface of a substrate disposed on a substrate support via a physical vapor deposition process, in the meanwhile amorphous silicon is also deposited atop components within the PVD process chamber; and depositing a glue layer atop the amorphous silicon deposited on the components. The glue layer can be a silicon compound. The silicon compound can be a compound of silicon with one or more of carbon, nitrogen, or oxygen. In some embodiments, the silicon compound is SiC, SiN, SiO, SiCN, or SiON.

14 Claims, 2 Drawing Sheets

200

DEPOSIT AMORPHOUS SILICON LAYER ATOP SURFACE OF A SUBSTRATE VIA A PHYSICAL VAPOR DEPOSITION PROCESS, WHEREIN AMORPHOUS SILICON IS DEPOSITED ATOP COMPONENTS WITHIN THE PVD CHAMBER — 202

DEPOSIT GLUE LAYER ATOP AMORPHOUS SILICON DEPOSITED ATOP COMPONENTS — 204

(51) Int. Cl.

| | |
|---|---|
| ***C23C 14/02*** | (2006.01) |
| ***C23C 14/06*** | (2006.01) |
| ***C23C 14/10*** | (2006.01) |
| ***C23C 14/14*** | (2006.01) |
| ***H10P 14/20*** | (2026.01) |
| ***H10P 14/22*** | (2026.01) |

(52) U.S. Cl.

CPC ...... *C23C 14/0635* (2013.01); *C23C 14/0676* (2013.01); *C23C 14/10* (2013.01); *C23C 14/14* (2013.01); *H10P 14/3411* (2026.01); *H10P 14/22* (2026.01); *H10P 14/3454* (2026.01)

(56) References Cited

U.S. PATENT DOCUMENTS

2014/0036340 A1 2/2014 Hong et al.
2016/0168687 A1* 6/2016 Ramalingam ........... H01J 37/34 204/192.12
2016/0358809 A1* 12/2016 Brown .............. H01J 37/32477
2016/0372319 A1 12/2016 Zeng et al.
2017/0098575 A1 4/2017 Kesapragada et al.
2017/0125215 A1 5/2017 Cheng et al.
2019/0144992 A1* 5/2019 Kim .................... H01J 37/3464 204/192.12
2020/0063262 A1 2/2020 Katou et al.
2021/0057194 A1* 2/2021 Kon .................. H01J 37/32091
2021/0225710 A1 7/2021 Yim et al.
2022/0301828 A1 9/2022 Dou et al.

* cited by examiner

PARTICLE REDUCTION IN PHYSICAL VAPOR DEPOSITION OF AMORPHOUS SILICON

CROSS-REFERENCE TO RELATED APPLICATIONS

This application claims benefit of U.S. provisional patent application Ser. No. 63/416,083, filed Oct. 14, 2022, which is herein incorporated by reference.

FIELD

Embodiments of the present disclosure generally relate to methods for depositing films via physical vapor deposition.

BACKGROUND

Amorphous silicon films are used in a variety of semiconductor manufacturing applications. Typically, amorphous silicon films may be formed via a physical vapor deposition (PVD) process. The inventors have observed that conventional processes for depositing amorphous silicon films can lead to undesirable amounts of particle formation on substrates being processed.

Accordingly, the inventors have provided improved methods for depositing amorphous silicon films via physical vapor deposition processes.

SUMMARY

Methods for depositing amorphous silicon films via physical vapor deposition processes are disclosed. In embodiments, methods disclosed herein include periodically depositing a glue layer atop amorphous silicon (α-Si) deposited atop components of the processing chamber to suppress particle generation. The inventive methods provide for suppression of cohesive failure via an interface interlock between a glue layer and deposited α-Si layers. The provided deposition techniques advantageously improve particle performance of PVD deposited α-Si.

Methods for depositing amorphous silicon films via physical vapor deposition processes are disclosed. In some embodiments, a method of depositing amorphous silicon in a physical vapor deposition (PVD) process chamber includes (a) depositing an amorphous silicon layer atop a surface of a substrate disposed on a substrate support via a physical vapor deposition process, in the meanwhile amorphous silicon is also deposited atop components within the PVD process chamber; and depositing a glue layer atop the amorphous silicon deposited on the components. The glue layer can be a silicon compound. The silicon compound can be a compound of silicon with one or more of carbon, nitrogen, or oxygen. In some embodiments, the silicon compound is SiC, SiN, SiO, SiCN, or SiON.

In some embodiments, a method of depositing amorphous silicon in a physical vapor deposition (PVD) process chamber includes: (a) sequentially depositing an amorphous silicon layer atop respective surfaces of a plurality of substrates sequentially disposed on a substrate support via a physical vapor deposition process, wherein amorphous silicon is deposited atop components within the PVD process chamber; and (b) placing a shutter disk atop a substrate support of the PVD process chamber and depositing a glue layer atop the amorphous silicon deposited on the components.

In some embodiments, a method of depositing amorphous silicon in a physical vapor deposition (PVD) process chamber, includes: (a) sequentially depositing an amorphous silicon layer atop respective surfaces of a plurality of substrates sequentially disposed on a substrate support via a physical vapor deposition process, wherein amorphous silicon is deposited atop components within the PVD process chamber, and wherein the sequential deposition continues until the amorphous silicon deposited atop components reaches a predetermined thickness; (b) subsequently placing a shutter disk atop a substrate support of the PVD process chamber and depositing a glue layer atop the amorphous silicon deposited on the components, wherein the glue layer comprises a silicon compound; (c) depositing a conditioning layer atop the glue layer, wherein the conditioning layer composition transitions from that of the glue layer to amorphous silicon; and (e) after depositing the conditioning layer, repeating (a).

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
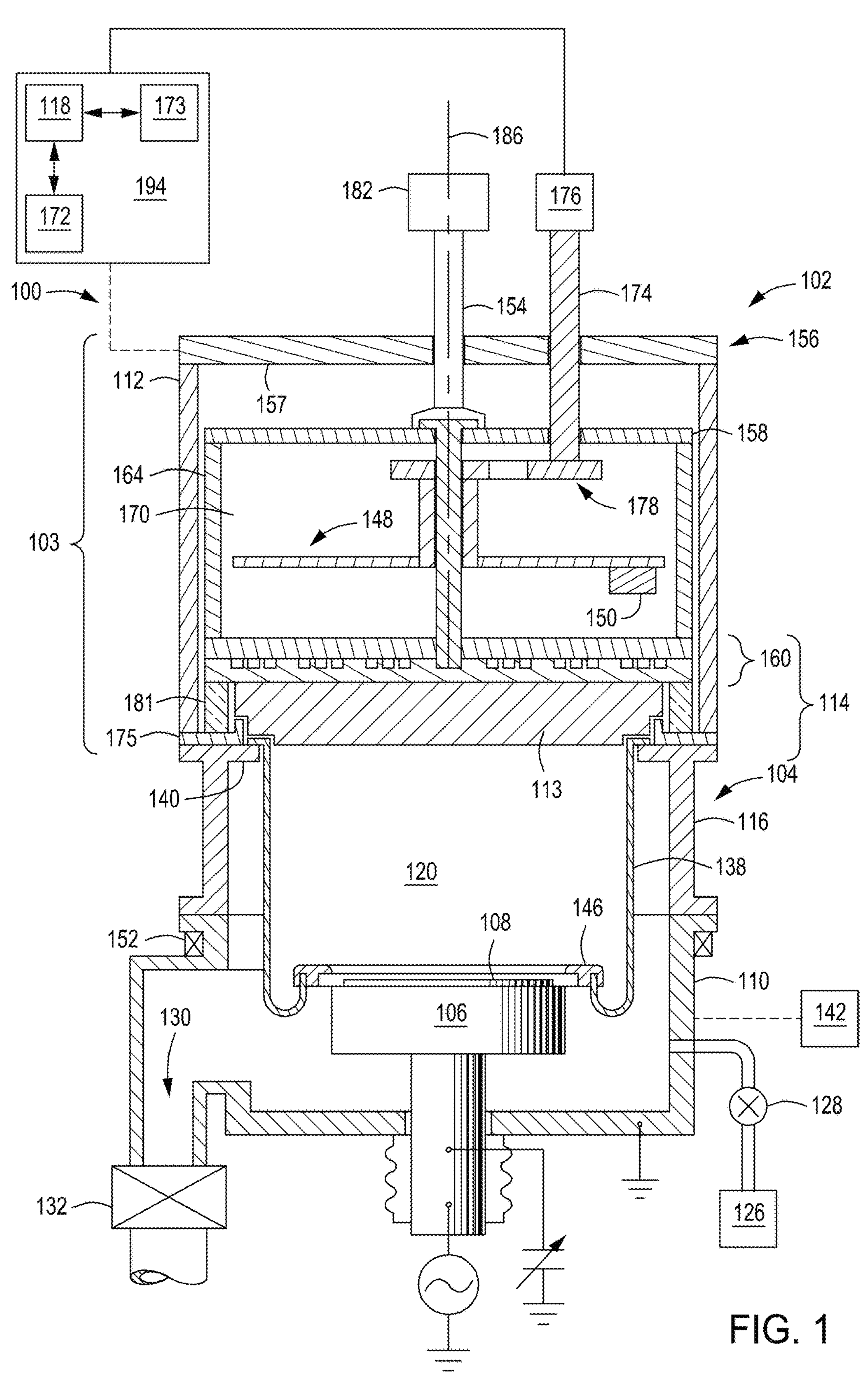
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of depositing amorphous silicon (α-Si) films via physical vapor deposition (PVD) processes. In at least some embodiments, the inventive methods described herein advantageously provide a low-cost, robust, and effective approach to improve particle performance during deposition of amorphous silicon films. Embodiments of the inventive method further have minimal effects on other critical uni-film performance, which ensures flexible tunability of the process window to control defectivity. Although described herein with respect to the deposition of amorphous silicon films, embodiments of the present disclosure can also be use advantageously in the deposition of other dielectric films to control defectivity by interface interlock as disclosed herein.

FIG. 1 depicts a simplified, cross-sectional view of an illustrative physical vapor deposition (PVD) processing system 100 suitable for performing methods in accordance with at least some embodiments of the present disclosure. The PVD processing system shown in FIG. 1 is merely illustrative and not intended to limit the scope of the disclosure. Embodiments of the inventive disclosure can also be performed in other PVD processing systems in accordance with the teachings provided herein. Further examples of PVD processing systems suitable for performing the methods described herein include PVD processing systems commercially available from Applied Materials, Inc., of Santa Clara, California.

Figure 2:
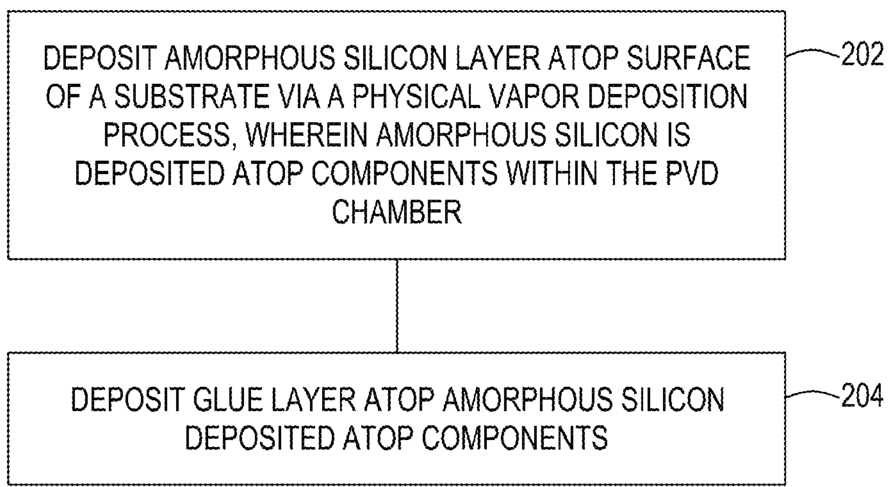
FIG. 2 depicts a method of depositing amorphous silicon in accordance with embodiments of the present disclosure.

FIG. 2 depicts a flow chart of a method 200 for depositing an amorphous silicon layer atop a substrate disposed in a physical vapor deposition processing system, for example as described in FIG. 1. The method 200 is described below with respect to FIG. 1 and FIG. 3.

The PVD process chamber 104 depicted in FIG. 1 comprises a substrate support 106, a target assembly 114 having an optional backing plate assembly 160 and source material 113 which is disposed on a substrate support facing side of the backing plate assembly 160. The PVD process chamber 104 further comprises a pulsed DC power source 182 to provide pulsed DC energy to the target assembly 114. Additional details relating to the illustrative PVD processing system 100 are discussed below.

The method 200 begins at 202 by depositing an amorphous silicon layer atop a surface of a substrate via a physical vapor deposition process, wherein amorphous silicon is further deposited atop components within the PVD process chamber (e.g., the PVD process chamber 104).

The substrate may be any suitable substrate having any suitable geometry, such as a round wafer, square, rectangular, or the like. The substrate may comprise any suitable materials, such as one or more of silicon (Si), silicon oxide ($SiO_2$), silicon nitride (SiN), glass, other dielectric materials, or the like, and may have one or more layers of other materials disposed atop the substrate. The substrate may be a blank substrate (e.g., having no features disposed thereon), or the substrate may have features formed in or on the substrate, such as vias or trenches, or high aspect ratio features.

In some embodiments, the amorphous silicon layer can be formed by any suitable PVD process for sputtering silicon source material onto the substrate to form an amorphous silicon layer. For example, depositing the amorphous silicon layer can include providing a plasma forming gas to a processing region 120 of the physical vapor deposition process chamber (e.g., PVD process chamber 104). The plasma forming gas may include one or more inert gases, such as a noble gas, or other inert gases. DC power can be provided to a target assembly 114 disposed opposite the substrate to form a plasma within the processing region 120 of the PVD process chamber 104. The DC power is an amount of DC power suitable to form a plasma within the processing region 120 and may vary depending upon chamber size, geometry, or the like. The plasma is used to sputter a source material 113 from the target assembly 114 to deposit the amorphous silicon layer onto the substrate. For example, the source material 113 consists of or consists essentially of silicon, for example single crystal silicon.

Figure 3:
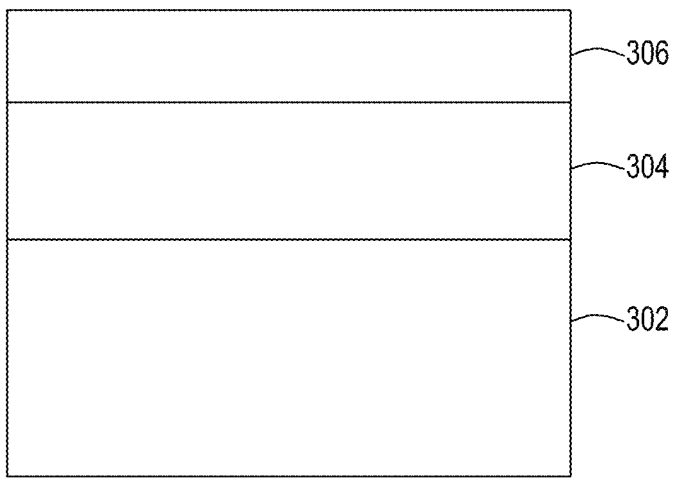
FIG. 3 depicts a schematic representation of layers deposited in accordance with embodiments of the present disclosure.

As depicted in FIG. 3, depositing the amorphous silicon layer atop the surface of the substrate results in an amorphous silicon layer 304 deposited atop components (e.g., component 302) within the PVD process chamber (e.g., the PVD process chamber 104), such as process volume facings surfaces of internal PVD chamber components. Examples of the component 302 include shields, cover rings, or the like (e.g., see shield 138 and cover ring 146 discussed below with respect to FIG. 1). Over time, as sequential substrates are processed and amorphous silicon films deposited thereon, the thickness of the amorphous silicon coating on the chamber components continues to increase. For example, many substrates, such as tens of substrate or hundreds of substrates can be sequentially processed in the PVD chamber to have amorphous silicon layers deposited as described above.

The inventors have observed that if the thickness of the amorphous silicon layer deposited on the chamber components becomes too great, the amorphous silicon film disposed on the chamber components can begin to flake off, undesirably resulting in particle deposition on substrates subsequently processed in the PVD chamber. The inventors have discovered that by depositing a glue layer (e.g., glue layer 306) atop the amorphous silicon layer 304 on the chamber components, the particle formation from that source can be reduced or eliminated.

Accordingly, next, at 204, glue layer 306 is deposited atop the amorphous silicon layer 304 deposited on the chamber components (e.g., component 302). In embodiments, the glue layer is a silicon compound. In embodiments, the silicon compound is a compound of silicon with one or more of carbon, nitrogen, or oxygen. For example, the silicon compound can be SiC, SiN, SiO, SiCN, or SiON, or the like.

In embodiments, the amorphous silicon is deposited sequentially atop a plurality of substrates until a thickness of amorphous silicon deposited atop components within the PVD process chamber reaches a predetermined amount. For example, in some embodiments, up to about 15,000 angstroms of amorphous silicon can accumulate on the PVD chamber components. In embodiments, depositing the glue layer occurs after the thickness of amorphous silicon deposited atop components within the PVD process chamber reaches the predetermined amount. In some embodiments, after depositing the glue layer, the deposition of amorphous silicon on one or more substrates can be repeated (e.g., continued). The inventors believe that the glue layer 306 acts as an interface interlock with the amorphous silicon layer 304 to robustly bond together and prevent flaking or delamination of the amorphous silicon layer 304 and/or the glue layer 306 from the chamber component, as well as with respect to subsequently deposited amorphous silicon layers atop the glue layer 306 as processing continues.

In some embodiments, the glue layer can be deposited to a thickness up to about 5,000 angstroms, such as from about 5 angstroms to about 5,000 angstroms. In some embodiments, the glue layer can be deposited in a plurality of sub-layers in a pulsed DC deposition process.

Depositing the glue layer can be performed with a shutter disk (e.g., shutter disk 142 discussed below with respect to FIG. 1) disposed atop a substrate support (e.g., 106) of the PVD process chamber (e.g., 104). For example, after removal of a substrate having an amorphous silicon layer deposited thereon, a shutter disk may be placed over the substrate support. One or more process gases including the element to be part of the silicon compound is provided to the PVD processing chamber and a pasting operation is performed to deposit the glue layer 306 atop the amorphous silicon layer 304. Non-limiting examples of process gases include nitrogen ($N_2$), ammonia ($NH_3$), methane ($CH_4$), oxygen ($O_2$), or the like. The pasting operation can proceed in any suitable manner, such as by providing DC power to the target while flowing one or more process gases as noted above. Upon completion of the deposition of the glue layer 306, the shutter disk can be removed and further processing, such as continuing to deposit amorphous silicon layers on subsequent substrates can continue.

In some embodiments, a conditioning process can be performed subsequent to depositing the glue layer 306 and prior to repeating deposition of the amorphous silicon. For example, the conditioning process can be used to clean the surface of the source material of target to obtain a suitably clean surface to resume deposition of the amorphous silicon layer. In some embodiments, the glue layer can be deposited to a thickness up to about 5,000 angstroms. In some embodiments, the conditioning process can deposit a conditioning layer to a determined thickness, such as up to about 1,000 angstroms. In some embodiments, the conditioning process is performed using the same deposition conditions used to deposit amorphous silicon to transition from glue layer deposition to amorphous silicon deposition. For example, the conditioning layer can have a composition that transitions, or gradually changes, from the glue layer (e.g., a silicon compound layer) to amorphous silicon. For example, if using $N_2$ gas to deposit a $SiN_x$ glue layer, the conditioning layer may have a composition that transitions from $SiN_x$ to N-doped silicon, to amorphous silicon. Similar transitions may be obtained when using other process gases to deposit glue layers having other compositions. In some embodiments, the conditioning process can be a pulsed DC deposition process that deposits a plurality of sublayers that together form the conditioning layer.

In some embodiments, a glue layer similar to the glue layer 306 (e.g., formed in the same manner as disclosed above) can be deposited prior to deposition of amorphous silicon on a substrate in the PVD process chamber. For example, when a new target is provided in the PVD chamber, an initial burn in and/or conditioning process may be performed to ready the target for production and the deposition of the glue layer 306 can be performed between the burn in or conditioning process and the amorphous silicon deposition process.

In some embodiments, the above method can be repeated as needed periodically. For example, the above method can be repeated periodically over the life of the target and again after installation and conditioning of a new target.

Returning to FIG. 1, the PVD process chamber 104 includes a removable chamber lid 102. The chamber lid 102 may include the target assembly 114 and a grounding assembly 103. The PVD process chamber 104 contains a substrate support 106 for receiving a substrate 108. The substrate support 106 may be located within a lower grounded enclosure wall 110.

The DC power source 182 is coupled to target assembly 114, for example via electrode 154, to provide DC power to the target assembly 114. In some embodiments, the DC power source 182 is a pulsed DC power source to provide pulsed DC energy, for example, to enhance a sputtering rate of the target material (and hence, a deposition rate on the substrate). The DC power may range from about 200 W to about 20 kilowatts (kW), although the amount of DC power applied may vary depending upon chamber geometry (e.g., target size or the like). The DC power may be adjusted to control the deposition rate of sputtered metal atoms on the substrate. For example, increasing the DC power can result in increased interaction of the plasma with the source material 113 and increased sputtering of metal atoms from the target assembly 114.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly. The magnetron assembly provides a rotating magnetic field proximate the target assembly 114 to assist in plasma processing within the PVD process chamber 104. The magnetron assembly includes a rotatable magnet assembly 148 disposed within the cavity 170. The rotatable magnet assembly 148 rotates about a central axis 186 of the PVD process chamber 104. In some embodiments, the magnetron assembly includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a processing region 120 of the PVD process chamber 104. The processing region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a slit valve (not shown) in the lower portion of the PVD process chamber 104 and thereafter raised to a deposition, or processing position. In some embodiments, the shutter disk 142 can be transferred into and out of the PVD process chamber 104 through the slit valve to be positioned over the substrate support 106 as needed for the method 200 as described above. In some embodiments, the shutter disk 142 can be stored within the PVD process chamber 104 or may be moved into and out of the PVD process chamber 104 through an opening other than the slit valve.

One or more gases may be supplied from a gas source 126 through a mass flow controller 128 into the lower part of the PVD process chamber 104. An exhaust port 130 may be provided and coupled to a pump (not shown) via a valve 132 for exhausting the interior of the PVD process chamber 104 and to facilitate maintaining a suitable pressure inside the PVD process chamber 104.

The PVD process chamber 104 further includes a process kit shield, or shield, 138 to surround the processing volume, or central region, of the PVD process chamber 104 and to protect other chamber components from damage and/or contamination from processing. In some embodiments, the shield 138 may be connected to a ledge 140 of an upper grounded enclosure wall 116 of the PVD process chamber 104. The shield 138 extends downwardly and may include a generally tubular portion having a generally constant diameter that generally surrounds the processing region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in the lower, loading position but rests on the outer periphery of the substrate support 106 when the substrate support is in the upper, deposition position to protect the substrate support 106 from sputter deposition. An additional deposition ring (not shown) may be used to protect the edges of the substrate support 106 from deposition around the edge of the substrate 108.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extend from the first surface 157 of the grounding plate 156 and surround the target assembly 114. The grounding assembly 103 may include a support member 175 to support the target assembly 114 within the grounding assembly 103. In some embodiments, a seal ring 181 may be disposed between the target assembly 114 and the support member 175 to insulate the target assembly 114 from the ground assembly 103.

The target assembly 114 may comprise a source material 113, such as silicon, for example, single crystal silicon, or the like, to be deposited on a substrate, such as the substrate 108 during sputtering. In some embodiments, the target assembly 114 may be fabricated substantially from the source material 113, without any backing plate to support the source material 113. In some embodiments, the target assembly 114 includes a backing plate assembly 160 to support the source material 113. The source material 113 may be disposed on a substrate support facing side of the backing plate assembly 160 as illustrated in FIG. 1.

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein, such as the method 200, may be stored in the memory 264 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to particular embodiments of the present disclosure, other and further embodiments of the disclosure may be devised without departing from the basic scope of the disclosure.

The invention claimed is:

1. A method of depositing amorphous silicon in a physical vapor deposition (PVD) process chamber, comprising:

(a) depositing an amorphous silicon layer atop a surface of a substrate disposed on a substrate support via a physical vapor deposition process, wherein amorphous silicon is further deposited atop components within the PVD process chamber; and (b) depositing a glue layer atop the amorphous silicon deposited on the components, wherein the glue layer is SiC, SiO, SiCN, SiON, or a combination thereof.

2. The method of claim 1, wherein the amorphous silicon is deposited sequentially atop a plurality of substrates until a thickness of the amorphous silicon deposited atop the components within the PVD process chamber reaches a predetermined amount.

3. The method of claim 2, wherein depositing the glue layer occurs after the thickness of the amorphous silicon deposited atop the components within the PVD process chamber reaches the predetermined amount.

4. The method of claim 3, further comprising:

after depositing the glue layer, repeating (a).

5. The method of claim 1, further comprising:

after depositing the glue layer, repeating (a).

6. The method of claim 1, wherein depositing the glue layer is performed with a shutter disk disposed atop the substrate support of the PVD process chamber.

7. The method of claim 1, further comprising:

repeatedly performing (a) to deposit a plurality of respective amorphous silicon layers atop surfaces of a corresponding plurality of substrates prior to performing (b).

8. The method of claim 1, further comprising:

depositing a conditioning layer atop the glue layer.

9. The method of claim 8, wherein the conditioning layer has a composition that transitions from that of the glue layer to amorphous silicon.

10. A method of depositing amorphous silicon in a physical vapor deposition (PVD) process chamber, comprising:

(a) sequentially depositing an amorphous silicon layer atop respective surfaces of a plurality of substrates sequentially disposed on a substrate support via a physical vapor deposition process, wherein amorphous silicon is deposited atop components within the PVD process chamber; and (b) placing a shutter disk atop the substrate support of the PVD process chamber and depositing a glue layer atop the amorphous silicon deposited on the components, wherein the glue layer is SiC, SiO, SiCN, SiON, or a combination thereof.

11. The method of claim 10, further comprising:

after depositing the glue layer, repeating (a).

12. The method of claim 11, further comprising:

depositing a conditioning layer atop the glue layer prior to repeating (a).

13. The method of claim 12, wherein a composition of the conditioning layer transitions from that of the glue layer to amorphous silicon.

14. A method of depositing amorphous silicon in a physical vapor deposition (PVD) process chamber, comprising:

(a) sequentially depositing an amorphous silicon layer atop respective surfaces of a plurality of substrates sequentially disposed on a substrate support via a physical vapor deposition process, wherein amorphous silicon is deposited atop components within the PVD process chamber, and wherein the sequential deposition continues until the amorphous silicon deposited atop the components reaches a predetermined thickness;

(b) subsequently placing a shutter disk atop the substrate support of the PVD process chamber and depositing a glue layer atop the amorphous silicon deposited on the components, wherein the glue layer comprises a silicon compound;

(c) depositing a conditioning layer atop the glue layer, wherein the conditioning layer composition transitions from that of the glue layer to amorphous silicon; and (e) after depositing the conditioning layer, repeating (a), wherein the glue layer is SiC, SiO, SiCN, SiON, or a combination thereof.

* * * * *